(12) United States Patent
Yamazaki

(10) Patent No.: US 8,183,568 B2
(45) Date of Patent: May 22, 2012

(54) SUBSTRATE FOR SEMICONDUCTOR DEVICE, SEMICONDUCTOR DEVICE, AND ELECTRONIC APPARATUS

(75) Inventor: Yasushi Yamazaki, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 91 days.

(21) Appl. No.: 12/903,512

(22) Filed: Oct. 13, 2010

(65) Prior Publication Data

US 2011/0101436 A1 May 5, 2011

(30) Foreign Application Priority Data

Nov. 4, 2009 (JP) ................................. 2009-253223

(51) Int. Cl.
*H01L 21/00* (2006.01)
(52) U.S. Cl. ................ 257/59; 257/52; 257/83; 257/88; 257/314; 257/347; 257/E27.111; 257/E27.113; 257/E29.302
(58) Field of Classification Search ............. 257/52–59, 257/83, 88, 314–316, 347–350, E27.009, 257/81, 111, 113, 29.302
See application file for complete search history.

(56) References Cited

U.S. PATENT DOCUMENTS

| | | | | |
|---|---|---|---|---|
| 5,982,462 | A * | 11/1999 | Nakano et al. | 349/43 |
| 6,323,515 | B1 * | 11/2001 | Yamazaki et al. | 257/316 |
| 6,632,696 | B2 * | 10/2003 | Kimura et al. | 438/30 |
| 6,812,528 | B2 * | 11/2004 | Uchida | 257/355 |
| 7,279,709 | B2 | 10/2007 | Lan et al. | |
| 7,403,245 | B2 * | 7/2008 | Ahn et al. | 349/114 |
| 7,558,445 | B2 * | 7/2009 | Yasukawa | 385/2 |
| 7,675,067 | B2 * | 3/2010 | Song et al. | 257/72 |
| 7,692,973 | B2 * | 4/2010 | Miyazaki et al. | 365/185.33 |
| 7,830,465 | B2 * | 11/2010 | Moriwaki et al. | 349/43 |
| 2007/0145458 | A1 * | 6/2007 | Asami | 257/314 |
| 2008/0048190 | A1 * | 2/2008 | Ishii | 257/71 |
| 2008/0217618 | A1 * | 9/2008 | Deane | 257/59 |
| 2011/0101351 | A1 * | 5/2011 | Yamazaki | 257/57 |

FOREIGN PATENT DOCUMENTS

JP 2007-140440 6/2007
JP 4275671 B 3/2009

* cited by examiner

*Primary Examiner* — Michael Lebentritt
(74) *Attorney, Agent, or Firm* — AdvantEdge Law Group, LLC

(57) ABSTRACT

A substrate for a semiconductor device includes: a base substrate; a semiconductor layer that has a source region, a drain region, a plurality of channel regions, and at least one intermediate region; a source electrode being in contact with the source region; a drain electrode being in contact with the drain region; a gate electrode that overlaps the plurality of channel regions, the intermediate region, and each of a part of the source electrode and a part of the drain electrode; and a floating electrode being in contact with the intermediate region. The size of an area where the floating electrode and the gate electrode overlap each other is smaller than the sum of the size of an area where the source electrode and the gate electrode overlap each other and the size of an area where the drain electrode and the gate electrode overlap each other.

7 Claims, 7 Drawing Sheets

SUBSTRATE FOR SEMICONDUCTOR DEVICE, SEMICONDUCTOR DEVICE, AND ELECTRONIC APPARATUS

BACKGROUND

1. Technical Field

The present invention relates to a substrate for a semiconductor device, a semiconductor device that is provided with the substrate, and an electronic apparatus that is provided with the semiconductor device.

2. Related Art

A substrate that is used in a display device such as, for example, an electrophoretic display device that is driven in an active matrix scheme and includes a base substrate and a plurality of pixel-switching elements arranged over the base substrate is known as a type of a substrate for a semiconductor device. For example, a plurality of transistors each of which functions as the pixel-switching element is arranged over the base substrate. Such a substrate for a semiconductor device is sometimes called as an "active matrix substrate" or a "transistor array substrate".

As an example of related art, a transistor that functions as a pixel-switching element and has the following layered structure over the base substrate of a transistor array substrate is disclosed in Japanese Patent No. 4275671. The transistor has two gates. The gates partially overlap the source and drain of the transistor. A floating pattern partially overlaps the gates. With such a structure, it is possible to prevent the leakage of a current at the transistor, that is, the generation of a leakage current at the transistor when the transistor is in its OFF state.

However, the structure disclosed in Japanese Patent No. 4275671 has a technical problem in that, since each transistor has two gates, it will be difficult to miniaturize the transistor. For this reason, it will be difficult to enhance the high-definition display capability of a display device such as an electrophoretic display device or the like. The structure disclosed in Japanese Patent No. 4275671 has another technical problem as explained below. Though each transistor has two gates, if it is looked at from another angle, such a structure is equivalent to mere serial connection of two transistors each of which has one gate. Though such a structure makes it possible to reduce the leakage current of the transistor, the ON current of the transistor (i.e., a current that flows in a channel region when a predetermined voltage that is not lower than a threshold value is applied to the gate electrodes) will also drop.

SUMMARY

An advantage of some aspects of the invention is to provide a substrate for a semiconductor device that makes it possible to prevent, or significantly reduce, the generation of a leakage current at a transistor without a drop in the ON current of the transistor, a semiconductor device that is provided with such a substrate, and an electronic apparatus that is provided with such a semiconductor device.

In order to solve the above problems without any limitation thereto, a substrate for a semiconductor device according to a first aspect of the invention is provided. The substrate includes a base substrate, a semiconductor layer, a source electrode, a drain electrode, a gate electrode, and a floating electrode. The semiconductor layer has a source region, a drain region, a plurality of channel regions, and at least one intermediate region. The plurality of channel regions is formed between the source region and the drain region. The intermediate region is formed between the channel regions that are adjacent to each other or between each two of the plurality of channel regions that are adjacent to each other. The source electrode overlaps the source region in a plan view on or over the base substrate. The source electrode is in contact with the source region. The drain electrode overlaps the drain region in a plan view on or over the base substrate. The drain electrode is in contact with the drain region. The gate electrode overlaps the plurality of channel regions and the intermediate region and at least partially overlaps each of a part of the source electrode corresponding to the source region, the source electrode overlapping the source region at the part, and a part of the drain electrode corresponding to the drain region, the drain electrode overlapping the drain region at the part, in a plan view on or over the base substrate. The floating electrode overlaps, or is formed at an area or each area substantially corresponding to, the intermediate region in a plan view on or over the base substrate. The floating electrode is in contact with the intermediate region. The floating electrode is made of the same material as that of the source electrode and the drain electrode. In an area where the semiconductor layer is formed on or over the base substrate, in a plan view, the size of an area where the floating electrode and the gate electrode overlap each other is smaller than the sum of the size of an area where the source electrode and the gate electrode overlap each other and the size of an area where the drain electrode and the gate electrode overlap each other.

A substrate for a semiconductor device according to the first aspect of the invention includes a base substrate and, for example, a plurality of transistors that has a layered structure including a semiconductor layer, a source electrode, a drain electrode, a gate electrode, and a floating electrode. The transistors are formed on the base substrate. The substrate according to the first aspect of the invention is used, for example, in a display device such as an electrophoretic display device that is driven in an active matrix scheme or the like.

The semiconductor layer has a plurality of channel regions that is formed between a source region and a drain region. At least one intermediate region is formed between the channel regions that are adjacent to each other or between each two of the plurality of channel regions that are adjacent to each other. The intermediate region is typically doped with the same impurity as that of the source region and the drain region at the same concentration as that of the source region and the drain region.

The gate electrode is formed either at a lower-layer-side position or at an upper-layer-side position in a layered structure on or over the base substrate in comparison with the semiconductor layer. The gate electrode is formed opposite to the plurality of channel regions and the intermediate region. A layer such as, for example, an insulator film is sandwiched between the gate electrode and the channel/intermediate regions. The gate electrode overlaps the plurality of channel regions and the intermediate region in a plan view on or over the base substrate. In addition, the gate electrode at least partially overlaps each of a part of the source electrode corresponding to the source region and a part of the drain electrode corresponding to the drain region in a plan view on or over the base substrate. The source electrode overlaps the source region at the first-mentioned part. The drain electrode overlaps the drain region at the second-mentioned part. In other words, the gate electrode has a body part, which is formed opposite to the plurality of channel regions and the intermediate region, a source-electrode facing part, which extends from the body part to the source-electrode side and is formed opposite to the source electrode, and a drain-electrode facing part, which extends from the body part to the drain-electrode side and is formed opposite to the drain electrode.

The floating electrode is typically made of the same material as that of the source electrode and the drain electrode (the source electrode is made of the same material as that of the drain electrode). It is preferable that the source electrode, the drain electrode, and the floating electrode should be formed in the same layer in the layered structure on or over the base substrate. The floating electrode overlaps, or is formed at an area or each area substantially corresponding to, the intermediate region, which is formed between the channel regions that are adjacent to each other or between each two of the plurality of channel regions that are adjacent to each other, in a plan view on or over the base substrate. If the floating electrode is formed at an upper-layer-side position in the layered structure in comparison with the semiconductor layer, in a step in the process of manufacturing the substrate according to the first aspect of the invention, the floating electrode is typically used as an etching mask for forming the plurality of channel regions. For this reason, in such a case, the area of the floating electrode almost perfectly coincides with the intermediate region. In other words, the part of the semiconductor layer that is formed at the area of the floating electrode in a plan view constitutes the intermediate region.

In the above aspect of the invention, in an area where the semiconductor layer is formed on or over the base substrate, in a plan view, the size of an area where the floating electrode and the gate electrode overlap each other is smaller than the sum of the size of an area where the source electrode and the gate electrode overlap each other and the size of an area where the drain electrode and the gate electrode overlap each other. In other words, the source electrode, the drain electrode, the gate electrode, and the floating electrode are arranged in the area where the semiconductor layer is formed on or over the base substrate in such a manner that the following relational expression holds true.

(The area where the floating electrode and the gate electrode overlap each other)<(The area where the source electrode and the gate electrode overlap each other)+(The area where the drain electrode and the gate electrode overlap each other)

Because of the above relationship, it is possible to ensure that contact resistance between the floating electrode and the intermediate region is higher than each of contact resistance between the source electrode and the source region and contact resistance between the drain electrode and the drain region. Therefore, it is possible to ensure that, when a voltage is applied between the source electrode and the drain electrode, a voltage drop due to the contact resistance between the floating electrode and the intermediate region is larger than each of a voltage drop due to the contact resistance between the source electrode and the source region and a voltage drop due to the contact resistance between the drain electrode and the drain region. Thus, when the transistor is in its OFF state, it is possible to decrease the voltage applied to at least one of the plurality of channel regions (e.g., the channel region next to the drain region), and in addition thereto, to decrease the voltage applied between the gate electrode and the floating electrode (i.e., gate OFF bias). Consequently, it is possible to prevent the generation of a leakage current at the transistor when the transistor is in its OFF state. Moreover, when the transistor is in its ON state, a predetermined gate voltage (i.e., gate ON bias) is applied to the gate electrode. As a result, the contact resistance between the floating electrode and the intermediate region becomes lower than resistance at the channel region (i.e., channel resistance). Because of the lower contact resistance therebetween, there is almost no drop in an ON current, or there is no drop therein at all.

Furthermore, unlike the related-art structure disclosed in Japanese Patent No. 4275671, which includes two gate electrodes, the gate electrode according to the above aspect of the invention is formed as a single continuous electrode, for example, a single continuous rectangular electrode. Such a structure is advantageous in terms of easier patterning in manufacturing process, which makes it possible to miniaturize transistors.

As explained above, the substrate for a semiconductor device according to the first aspect of the invention makes it possible to prevent the generation of a leakage current at a transistor without a drop in the ON current of the transistor.

In a preferred mode of the substrate for a semiconductor device according to the first aspect of the invention, the source electrode, the drain electrode, and the floating electrode should be formed in the same layer.

With such a preferred structure, it is possible to form the source electrode, the drain electrode, and the floating electrode in the same step in manufacturing process.

In another mode of the substrate for a semiconductor device according to the first aspect of the invention, it is preferable that the gate electrode should be formed at a lower-layer-side position in a layered structure in comparison with the semiconductor layer; and each of the source electrode, the drain electrode, and the floating electrode should be formed at an upper-layer-side position in the layered structure in comparison with the semiconductor layer.

With such a preferred mode, it is possible to form a top-contact bottom-gate type transistor on the base substrate.

In another mode of the substrate for a semiconductor device according to the first aspect of the invention, it is preferable that the gate electrode should be formed at a lower-layer-side position in a layered structure in comparison with the semiconductor layer; and each of the source electrode, the drain electrode, and the floating electrode should be formed at an upper-layer-side position in the layered structure in comparison with the gate electrode, which is a lower-layer-side position in the layered structure in comparison with the semiconductor layer.

With such a preferred mode, it is possible to form a bottom-contact bottom-gate type transistor on the base substrate.

In another mode of the substrate for a semiconductor device according to the first aspect of the invention, it is preferable that the gate electrode should be formed at an upper-layer-side position in a layered structure in comparison with the semiconductor layer; and each of the source electrode, the drain electrode, and the floating electrode should be formed at a lower-layer-side position in the layered structure in comparison with the semiconductor layer.

With such a preferred mode, it is possible to form a bottom-contact top-gate type transistor on the base substrate.

A semiconductor device according to a second aspect of the invention is provided with the substrate for a semiconductor device according to the first aspect of the invention, including its preferred modes.

Since the semiconductor device according to the second aspect of the invention is provided with the substrate according to the first aspect of the invention, which has the above features, it can be applied to various display devices that can display, for example, a high-definition image with a high quality, including but not limited to, an electrophoretic display device, a liquid crystal display device, and an organic electroluminescence (EL) display device.

An electronic apparatus according to a third aspect of the invention is provided with the semiconductor device according to the second aspect of the invention, including its preferred modes.

Since the electronic apparatus according to the third aspect of the invention is provided with the semiconductor device (e.g., electrophoretic display device) according to the second aspect of the invention, which has the above features, it can be applied to various electronic apparatuses that can display a high-definition image with a high quality, including but not limited to, a watch, a sheet of electronic paper, an electronic notebook, a mobile phone, a handheld audio device, and so forth.

These and other features, operations, and advantages of the present invention will be fully understood by referring to the following detailed description of an exemplary embodiment in conjunction with the accompanying drawings.

BRIEF DESCRIPTION OF THE DRAWINGS

The invention will be described with reference to the accompanying drawings, wherein like numbers reference like elements.

DESCRIPTION OF EXEMPLARY EMBODIMENTS

With reference to the accompanying drawings, an exemplary embodiment of the present invention will now be explained in detail. In the following description of an exemplary embodiment of the invention, an electrophoretic display device that is driven in an active matrix scheme and is provided with an active matrix substrate is taken as an example of a semiconductor device. The active matrix substrate is an example of a substrate for a semiconductor device according to an aspect of the invention.

First Embodiment

With reference to FIGS. 1 to 6, an electrophoretic display device according to a first embodiment of the invention is explained below.

Figure 1:
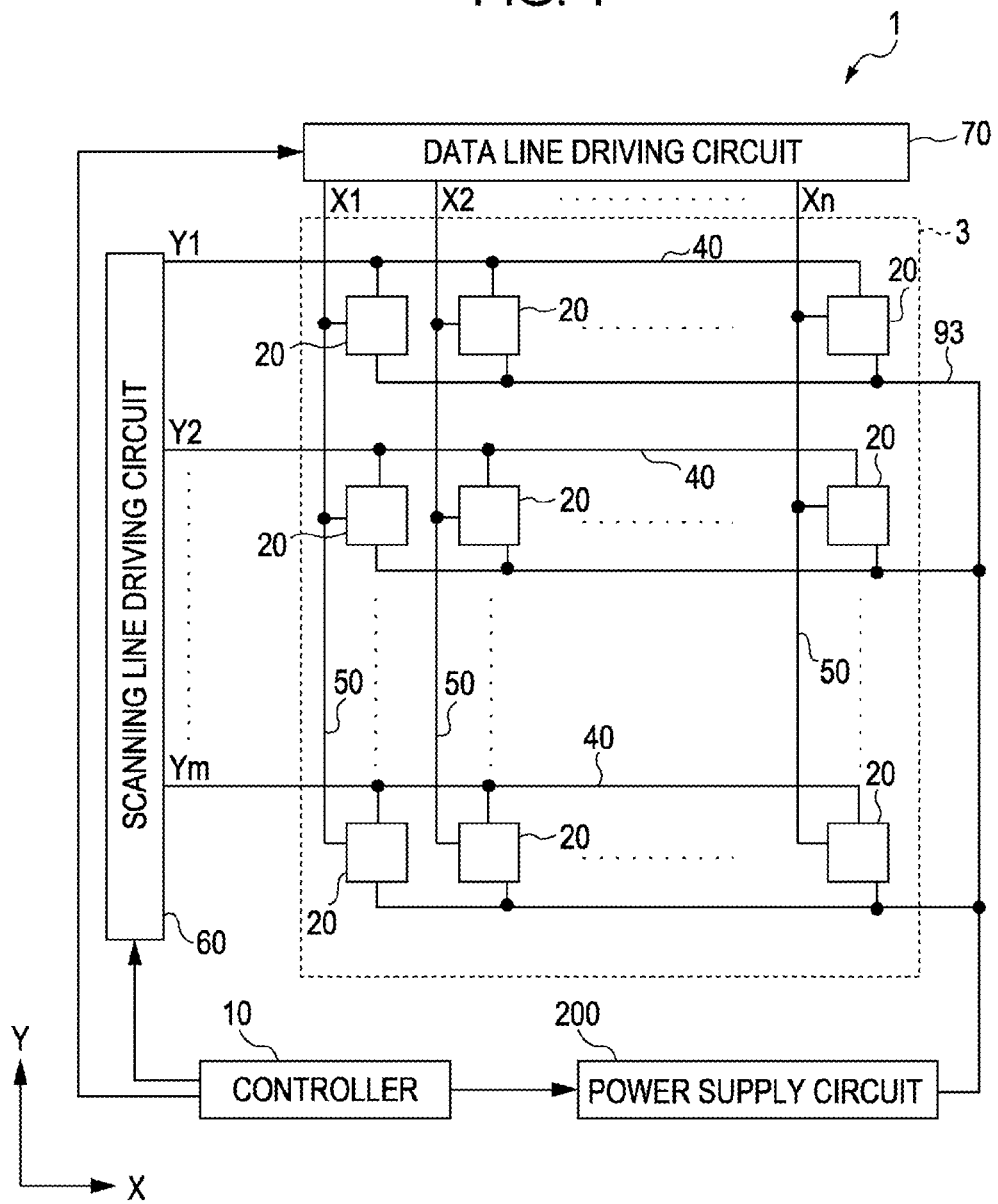
FIG. 1 is a block diagram that schematically illustrates an example of the general configuration of an electrophoretic display device according to a first embodiment of the invention.

First of all, an example of the general configuration of an electrophoretic display device according to the present embodiment of the invention is explained while referring to FIG. 1.

FIG. 1 is a block diagram that schematically illustrates an example of the general configuration of an electrophoretic display device according to an exemplary embodiment of the invention.

In FIG. 1, an electrophoretic display device 1 is provided with a display unit 3, a scanning line driving circuit 60, a data line driving circuit 70, a controller 10, and a power supply circuit 200.

A plurality of pixels 20 is arranged in a matrix pattern in the display area 3. In a plan view, the pixel-array matrix is made up of "m" rows and "n" columns. In addition, m number of scanning lines 40, which are denoted as Y1, Y2, . . . , Ym in the accompanying drawings, and n number of data lines 50, which are denoted as X1, X2, . . . , Xn therein, are provided in the display area 3. These m scanning lines 40 and n data lines 50 intersect with each other. Specifically, each of these m scanning lines 40 extends in the direction of the row, that is, in the X direction, whereas each of these n data lines 50 extends in the direction of the column, that is, in the Y direction. Each of the plurality of pixels 20 is provided at a pixel area corresponding to the intersection of a row and a column, that is, the corresponding one of intersections formed by the m scanning lines 40 and the n data lines 50.

The controller 10 controls the operation of each of the scanning line driving circuit 60, the data line driving circuit 70, and the power supply circuit 200.

The scanning line driving circuit 60 supplies scanning signals to the scanning lines Y1, Y2, . . . , Ym in a pulsed and sequential manner on the basis of a timing signal. On the other hand, the data line driving circuit 70 supplies image signals to the data lines X1, X2, . . . , Xn on the basis of a timing signal. The image signal is a ternary signal, which takes three levels. The three levels are a high voltage level (i.e., high potential), a middle voltage level, and a low voltage level. The high voltage level is hereinafter referred to as "high level". The middle voltage level is hereinafter referred to as "middle level". The low voltage level is hereinafter referred to as "low level". For example, the high level is 15V. The middle level is 0V. The low level is −15V. It is possible to perform halftone display by varying the pulse width and amplification of an image signal and varying the number of frames for supplying the image signal.

The power supply circuit 200 applies a voltage of a common level to a common voltage line 93. Though not illustrated in the drawing, the common voltage line 93 is electrically connected to the power supply circuit 200 via an electric switch. To simplify illustration, in FIG. 1, each of the plurality of pixels 20 is electrically connected to the common voltage line 93. However, in a typical configuration, the common voltage level is supplied to the plurality of pixels 20 via a common electrode 22 (refer to FIG. 3), which is provided opposite to the plurality of pixels 20. Notwithstanding the above, the common voltage line 93 may be electrically connected to each of the plurality of pixels 20 for supplying the common voltage level thereto as illustrated in FIG. 1.

Next, the specific configuration of a pixel portion(s) of the electrophoretic display device 1 is explained below with reference to FIGS. 2 and 3.

Figure 2:
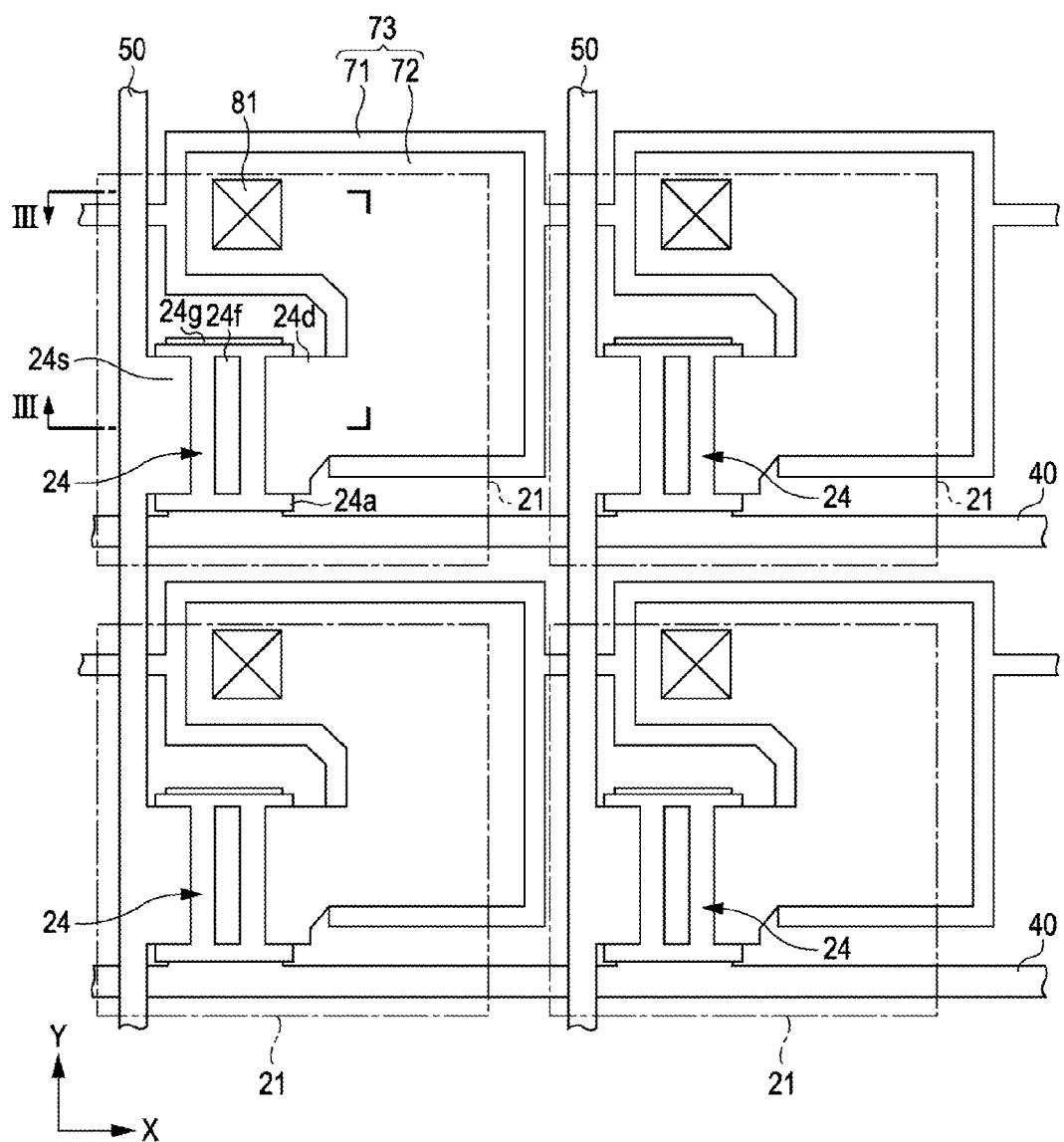
FIG. 2 is a plan view that schematically illustrates an example of a plurality of pixel portions arranged adjacent to one another according to the first embodiment of the invention.

FIG. 2 is a plan view that schematically illustrates an example of a plurality of pixel portions arranged adjacent to one another according to an exemplary embodiment of the invention. FIG. 3 is a sectional view taken along the line III-III of FIG. 2. In referring to FIGS. 2 and 3, it should be noted that different scales are used for layers/components illustrated in these drawings so that each of the layers/components has an illustrated size that is easily recognizable in each of these drawings. To simplify explanation, layers/components that are directly relevant to the concept of the present invention and/or necessary for explanation thereof only are shown in each of FIGS. 2 and 3.

Figure 3:
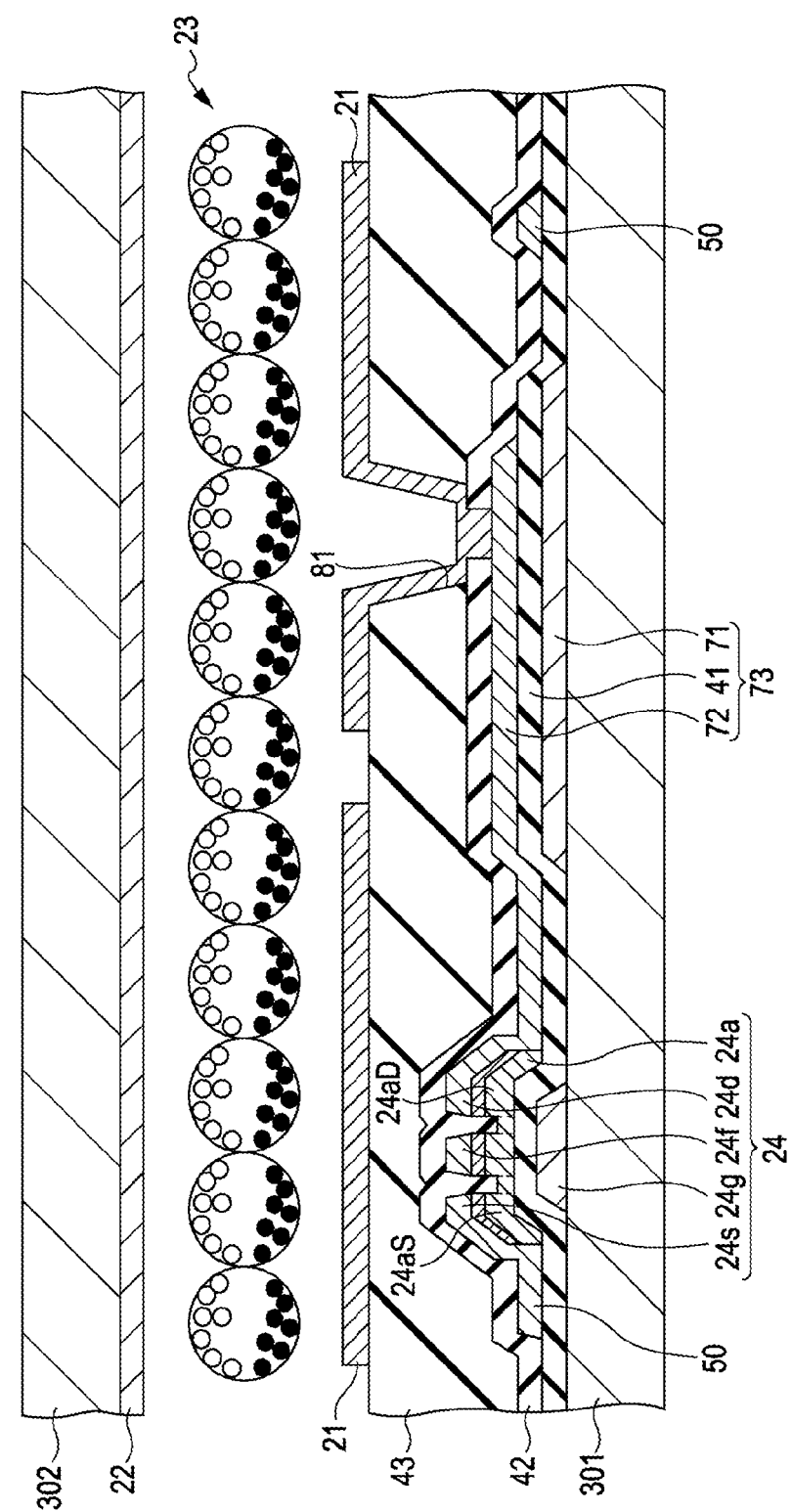
FIG. 3 is a sectional view taken along the line III-III of FIG. 2.

As illustrated in FIG. 3, an electrophoretic element 23 that is made up of a plurality of microcapsules is sandwiched between a pixel electrode 21 and a common electrode 22. Each of the plurality of microcapsules contains electrophoretic particles. The pixel electrode 21 is formed over a substrate 301. The common electrode 22 is formed on a substrate 302. The electrophoretic element 23 may be fixed between the pixel electrode 21 and the common electrode 22 with the use of an adhesive either between the electrophoretic element 23 and the pixel electrode 21 or between the electrophoretic element 23 and the common electrode 22. The electrophoretic element 23 may be disposed in contact with either the pixel electrode 21 or the common electrode 22, or in contact with both the pixel electrode 21 and the common electrode 22.

As illustrated in FIG. 2, the scanning line 40 extends in the X direction, whereas the data line 50 extends in the Y direction, which is orthogonal to the extending direction of the scanning line 40. The pixel electrode 21 is provided at an area corresponding to the intersection of the scanning line 40 and the data line 50. As illustrated in FIG. 2, the pixel electrode 21 is formed as a plurality of electrodes arranged in matrix layout over the substrate 301 (refer to FIG. 3). One pixel-switching transistor 24 is provided for each of the plurality of pixel electrodes 21.

As illustrated in FIGS. 2 and 3, the pixel-switching transistor 24 includes a semiconductor layer 24$a$, a source electrode 24$s$, a drain electrode 24$d$, a gate electrode 24$g$, and a floating electrode 24$f$. When a scanning signal is supplied through the scanning line 40 to the pixel-switching transistor 24, the pixel-switching transistor 24 is switched ON for a certain period of time. When the pixel-switching transistor 24 is in its ON state, a connection is established between the source electrode 24$s$ and the drain electrode 24$d$. As a result, an image signal that is supplied through the data line 50 is written into the pixel 20 at predetermined timing. In other words, a voltage corresponding to the image signal is applied between the pixel electrode 21 and the common electrode 22.

The source electrode 24$s$ is formed as a part of the data line 50. The source electrode 24$s$ is electrically connected to the source region 24$a$S of the semiconductor layer 24$a$. The drain electrode 24$d$ is formed as one part of a single continuous electrode that has the other or another part that constitutes an upper electrode 72 of a storage capacitor 73, which will be explained later. The drain electrode 24$d$ is electrically connected to the drain region 24$a$D of the semiconductor layer 24$a$. The gate electrode 24$g$ is formed as a part of the scanning line 40.

The structure of the pixel-switching transistor 24 will be explained in detail later while referring to FIGS. 4, 5, and 6.

As illustrated in FIG. 3, in a layered structure formed over the substrate 301, an insulator film 41 that is made of, for example, silicon nitride (SiN) is sandwiched between the semiconductor layer 24$a$ and the gate electrode 24$g$. A protection film 42 that is made of, for example, silicon nitride is formed over/on the semiconductor layer 24$a$ and on the data line 50 and the upper electrode 72.

As illustrated in FIGS. 2 and 3, to prevent the leakage of a voltage corresponding to an image signal held between the pixel electrode 21 and the common electrode 22, the aforementioned storage capacitor 73 is added in electrically parallel with a capacitor that is formed between the pixel electrode 21 and the common electrode 22 in each of the plurality of pixels 20. The storage capacitor 73 is made up of the upper electrode 72, a lower electrode 71, and the insulator film 41.

The pixel electrode 21 is electrically connected to the upper electrode 72 via a contact hole 81 that is formed through the protection film 42 and an inter-bedded (i.e., interlayer) insulator film 43. In FIG. 3, the part of the electrophoretic display device 1 from the substrate 301 to the pixel electrode 21 constitutes an active matrix substrate, which is an example of "a substrate for a semiconductor device" according to an aspect of the invention.

Next, the structure of the pixel-switching transistor 24 is explained in detail below while referring to FIGS. 4, 5, and 6.

Figure 4:
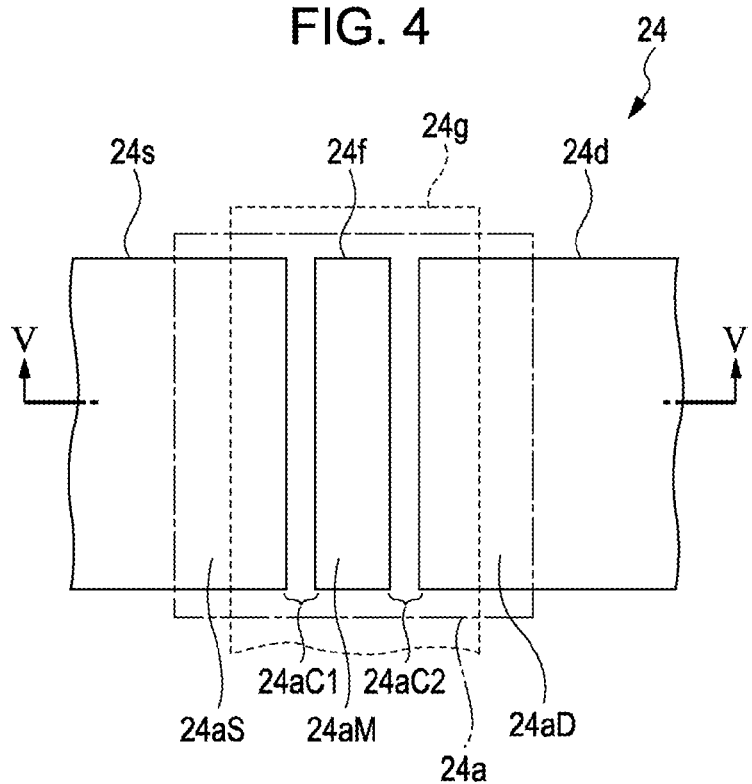
FIG. 4 is a plan view that schematically illustrates an example of the structure of a pixel-switching transistor according to the first embodiment of the invention.

FIG. 4 is a plan view that schematically illustrates an example of the structure of a pixel-switching transistor according to an exemplary embodiment of the invention. FIG. 5 is a sectional view taken along the line V-V of FIG. 4.

Figure 5:
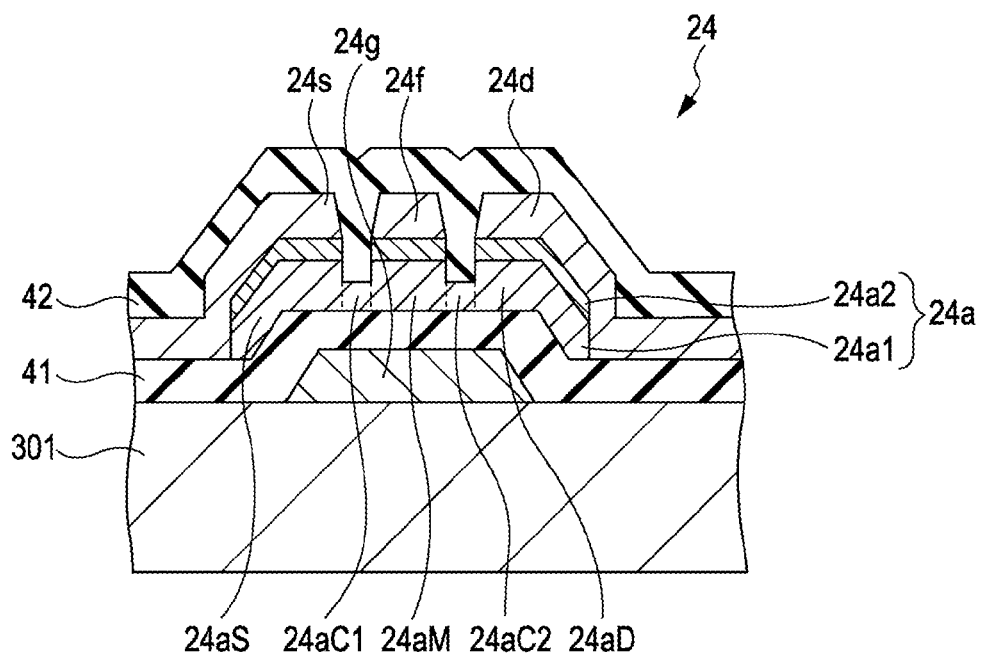
FIG. 5 is a sectional view taken along the line V-V of FIG. 4.

As explained above with reference to FIGS. 2 and 3, the pixel-switching transistor 24 illustrated in FIGS. 4 and 5 includes the semiconductor layer 24$a$, the source electrode 24$s$, the drain electrode 24$d$, the gate electrode 24$g$, and the floating electrode 24$f$.

As illustrated in FIG. 5, the semiconductor layer 24$a$ has a dual-layer structure that includes a first semiconductor layer 24$a$1 and a second semiconductor layer 24$a$2. The first semiconductor layer 24$a$1 is formed as the lower layer. The second semiconductor layer 24$a$2 is formed as the upper layer. The first semiconductor layer 24$a$1 is made of i type amorphous silicon (i.e., amorphous silicon with impurity not doped). The second semiconductor layer 24$a$2 is made of N+ type amorphous silicon.

As illustrated in FIGS. 4 and 5, the semiconductor layer 24$a$ has the source region 24$a$S, the drain region 24$a$D, channel regions 24$a$C1 and 24$a$C2, and a middle region 24$a$M.

The source region 24$a$S of the semiconductor layer 24$a$ is made up of the first semiconductor layer 24$a$1 and the second semiconductor layer 24$a$2. The source region 24$a$S is electrically connected to the source electrode 24$s$.

The drain region 24$a$D of the semiconductor layer 24$a$ is made up of the first semiconductor layer 24$a$1 and the second semiconductor layer 24$a$2. The drain region 24$a$D is electrically connected to the drain electrode 24$d$.

The first semiconductor layer 24$a$1 only is formed at each of the channel regions 24$a$C1 and 24$a$C2. The channel regions 24$a$C1 and 24$a$C2 are formed between the source region 24$a$S and the drain region 24$a$D. The channel regions 24$a$C1 and 24$a$C2 are distanced from each other with the middle region 24$a$M therebetween. The channel region 24$a$C1 is formed between the source region 24$a$S and the middle region 24$a$M. The channel region 24$a$C2 is formed between the drain region 24$a$D and the middle region 24$a$M.

The middle region 24$a$M of the semiconductor layer 24$a$ is made up of the first semiconductor layer 24$a$1 and the second semiconductor layer 24$a$2. The middle region 24$a$M is formed between the channel regions 24$a$C1 and 24$a$C2. The middle region 24$a$M is electrically connected to the floating electrode 24$f$.

The source electrode 24s is made of metal. The source electrode 24s is formed at a relatively high layer level, that is, at an upper-layer-side position in the layered structure, in comparison with the semiconductor layer 24a. For example, the source electrode 24s is formed on the semiconductor layer 24a. A part of the source electrode 24s is formed at the area corresponding to the source region 24aS over the substrate 301 in a plan view. That is, the source electrode 24s overlaps the source region 24aS in a plan view. It is in contact with the source region 24aS. Therefore, the source electrode 24s and the source region 24aS are electrically connected to each other.

The drain electrode 24d is made of the same metal material as that of the source electrode 24s. The layer level of the drain electrode 24d is the same as that of the source electrode 24s. That is, the drain electrode 24d is formed at a relatively high layer level in comparison with the semiconductor layer 24a. A part of the drain electrode 24d is formed at the area corresponding to the drain region 24aD over the substrate 301 in a plan view. That is, the drain electrode 24d overlaps the drain region 24aD in a plan view. It is in contact with the drain region 24aD. Therefore, the drain electrode 24d and the drain region 24aD are electrically connected to each other.

The gate electrode 24g is formed at a lower-layer-side position in the layered structure, for example, under the semiconductor layer 24a. The gate electrode 24g is formed opposite to the channel regions 24aC1 and 24aC2 and the middle region 24aM with the insulator film 41 sandwiched therebetween. In a plan view, the gate electrode 24g overlaps the two channel regions 24aC1 and 24aC2, the middle region 24aM, the part of the source electrode 24s that is formed at the area corresponding to the source region 24aS (i.e., the "source-region overlapping part" of the source electrode 24s), and the part of the drain electrode 24d that is formed at the area corresponding to the drain region 24aD (i.e., the "drain-region overlapping part" of the drain electrode 24d) over the substrate 301.

The floating electrode 24f is made of the same metal material as that of the source electrode 24s and the drain electrode 24d. The layer level of the floating electrode 24f is the same as that of the source electrode 24s and the drain electrode 24d. That is, the floating electrode 24f is formed at a relatively high layer level in comparison with the semiconductor layer 24a. The floating electrode 24f is formed over the substrate 301 at the area corresponding to the middle region 24aM in a plan view. The floating electrode 24f is in contact with the middle region 24aM. Therefore, the floating electrode 24f and the middle region 24aM are electrically connected to each other. In a step in the process of manufacturing an active matrix substrate according to the present embodiment of the invention, the floating electrode 24f is used together with the source electrode 24s and the drain electrode 24d as an etching mask for forming the two channel regions 24aC1 and 24aC2. For this reason, the area of the floating electrode 24f almost perfectly coincides with the middle region 24aM. In other words, the part of the semiconductor layer 24a that is formed at the area of the floating electrode 24f in a plan view constitutes the middle region 24aM.

Figure 6:
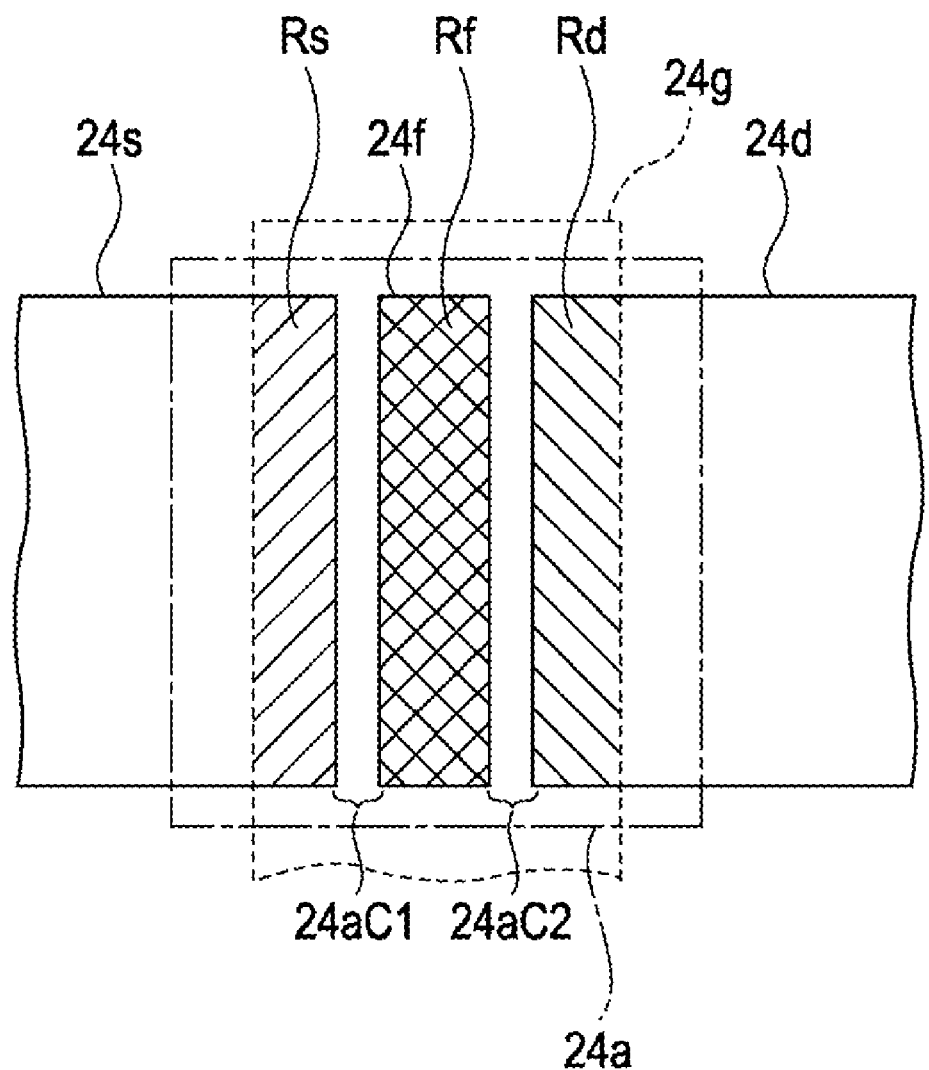
FIG. 6 is a plan view that schematically illustrates an example of a characteristic relationship in layout between a semiconductor layer, a gate electrode, a source electrode, a drain electrode, and a floating electrode in a pixel-switching transistor according to the first embodiment of the invention.

FIG. 6 is a plan view that schematically illustrates an example of a characteristic relationship in layout between a semiconductor layer, a gate electrode, a source electrode, a drain electrode, and a floating electrode in a pixel-switching transistor according to an exemplary embodiment of the invention.

As illustrated in FIG. 6, the present embodiment of the invention has the following characteristic layout in an area where the semiconductor layer 24a is formed over the substrate 301: in a plan view, the size of an area Rf, which is the area where the floating electrode 24f and the gate electrode 24g overlap each other, is smaller than the sum of the size of an area Rs, which is the area where the source electrode 24s and the gate electrode 24g overlap each other, and the size of an area Rd, which is the area where the drain electrode 24d and the gate electrode 24g overlap each other. That is, in the present embodiment of the invention, the source electrode 24s, the drain electrode 24d, the gate electrode 24g, and the floating electrode 24f are arranged in the area where the semiconductor layer 24a is formed over the substrate 301 in such a manner that a relational expression (1) shown in the next paragraph holds true.

(Size of Area Rf, that is, the area where the floating electrode 24f and the gate electrode 24g overlap each other)<(Size of Area Rs, that is, the area where the source electrode 24s and the gate electrode 24g overlap each other)+(Size of Area Rd, that is, the area where the drain electrode 24d and the gate electrode 24g overlap each other)    (1)

Because of the above relationship, it is possible to ensure that contact resistance between the floating electrode 24f and the middle region 24aM (refer to FIG. 5) is higher than each of contact resistance between the source electrode 24s and the source region 24aS (refer to FIG. 5) and contact resistance between the drain electrode 24d and the drain region 24aD (refer to FIG. 5). Therefore, it is possible to ensure that, when a voltage is applied between the source electrode 24s and the drain electrode 24d, a voltage drop due to the contact resistance between the floating electrode 24f and the middle region 24aM is larger than each of a voltage drop due to the contact resistance between the source electrode 24s and the source region 24aS and a voltage drop due to the contact resistance between the drain electrode 24d and the drain region 24aD. Thus, when the pixel-switching transistor 24 is in its OFF state, which means that no scanning signal is now being supplied from the scanning line driving circuit 60 to the gate electrode 24g, it is possible to decrease the voltage applied to the channel region 24aC1 or the channel region 24aC2 (i.e., the voltage applied between the source region 24aS and the middle region 24aM or between the middle region 24aM and the drain region 24aD), and in addition thereto, to decrease the voltage applied between the gate electrode 24g and the floating electrode 24f (i.e., gate OFF bias corresponding to the channel region 24aC2). Consequently, it is possible to prevent the generation of a leakage current at the pixel-switching transistor 24 when the pixel-switching transistor 24 is in its OFF state. Moreover, when the pixel-switching transistor 24 is in its ON state, which means that a scanning signal is now being supplied from the scanning line driving circuit 60 to the gate electrode 24g, a voltage that is in accordance with the scanning signal (i.e., gate ON bias) is applied to the gate electrode 24g. As a result, since the resistance of the first semiconductor layer 24a1 (i type amorphous silicon) constituting a part of the middle region 24aM is decreased, the contact resistance between the floating electrode 24f and the middle region 24aM becomes lower than resistance at the channel region (i.e., channel resistance). Because of the lower contact resistance therebetween, there is almost no drop in an ON current (i.e., a current that should flow between the source electrode 24s and the drain electrode 24d when the pixel-switching transistor 24 is in its ON state), or there is no drop therein at all.

Furthermore, unlike the aforementioned related-art structure disclosed in Japanese Patent No. 4275671, which includes two gate electrodes, the gate electrode 24g according to the present embodiment of the invention is formed as a single continuous rectangular electrode. Such a structure is advantageous in terms of easier patterning in manufacturing process. Still furthermore, unlike the aforementioned related-art structure disclosed in Japanese Patent No. 4275671, according to which a part of a floating electrode is formed at partial areas of two gate electrodes in a plan view, in the present embodiment of the invention, the entire area of the floating electrode 24f is located inside the area of the gate electrode 24g in a plan view. With such a layout, the present embodiment of the invention can ensure reliable contact that is not susceptible to the effects of any alignment error. For this reason, it is possible to miniaturize the pixel-switching transistor 24.

Still furthermore, in the present embodiment of the invention, the layer level of the floating electrode 24f is the same as that of the source electrode 24s and the drain electrode 24d as explained earlier. In addition, the floating electrode 24f is made of the same metal material as that of the source electrode 24s and the drain electrode 24d as explained earlier. Therefore, it is possible to form the source electrode 24s, the drain electrode 24d, and the floating electrode 24f in the same step in manufacturing process. Thus, the present embodiment of the invention requires almost no complication of manufacturing process.

As explained above, the present embodiment of the invention makes it possible to prevent the generation of a leakage current at the pixel-switching transistor 24 without a drop in the ON current of the pixel-switching transistor 24.

In the present embodiment of the invention, a top-contact bottom-gate type transistor, which has a layered structure in which the gate electrode 24g is formed at a lower-layer-side position, for example, under the semiconductor layer 24a whereas each of the source electrode 24s and the drain electrode 24d is formed at an upper-layer-side position, for example, on the semiconductor layer 24a, is taken as an example of the pixel-switching transistor 24. However, the pixel-switching transistor 24 is not limited to such a top-contact bottom-gate type transistor. The pixel-switching transistor 24 may have a bottom-contact bottom-gate structure or a bottom-contact top-gate structure as disclosed as the following variation examples.

First Variation Example

Figure 7:
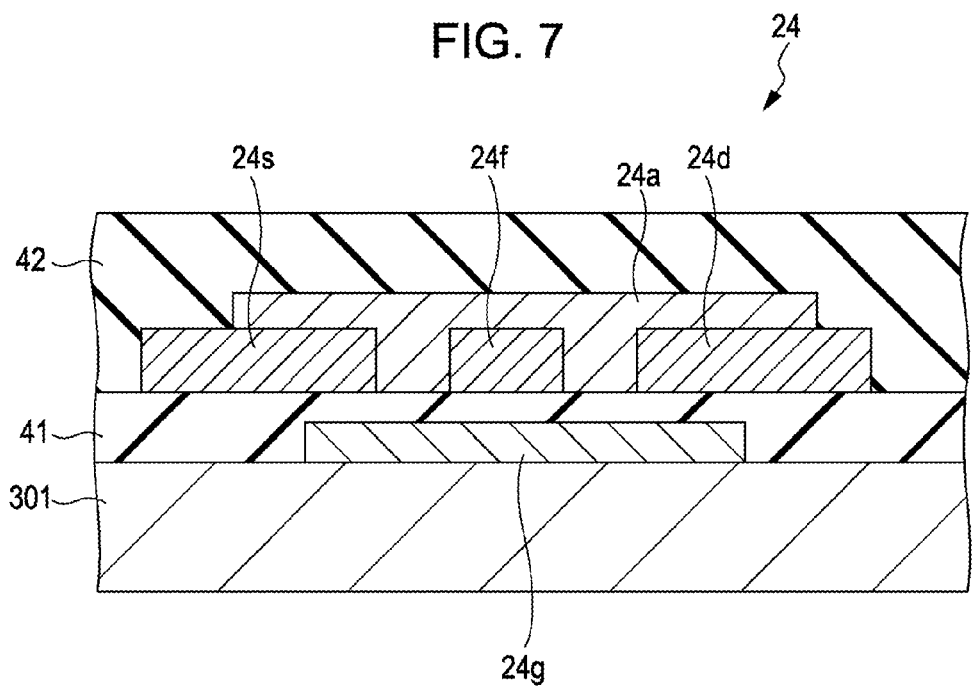
FIG. 7 is a sectional view that schematically illustrates the structure of a pixel-switching transistor according to a first variation example of the invention.

FIG. 7 is a sectional view that schematically illustrates the structure of a pixel-switching transistor according to a first variation example of the invention.

As illustrated in FIG. 7, the pixel-switching transistor 24 may be a bottom-contact bottom-gate type transistor.

Specifically, the pixel-switching transistor 24 according to the first variation example has the following layered structure. As illustrated in FIG. 7, the gate electrode 24g is formed at a relatively low layer level, that is, at a lower-layer-side position in the layered structure, in comparison with the semiconductor layer 24a. Each of the source electrode 24s, the drain electrode 24d, and the floating electrode 24f is formed at a relatively high layer level, that is, at an upper-layer-side position in the layered structure, in comparison with the gate electrode 24g but at a relatively low layer level, that is, at a lower-layer-side position in the layered structure, in comparison with the semiconductor layer 24a.

The structure according to the first variation example has the same characteristic layout as that of the foregoing exemplary embodiment of the invention. That is, in a plan view, the size of the area where the floating electrode 24f and the gate electrode 24g overlap each other is smaller than the sum of the size of the area where the source electrode 24s and the gate electrode 24g overlap each other and the size of the area where the drain electrode 24d and the gate electrode 24g overlap each other. Since the pixel-switching transistor 24 according to the first variation example has such a layout, it is possible to prevent the generation of a leakage current at the pixel-switching transistor 24 without a drop in the ON current of the pixel-switching transistor 24.

Second Variation Example

Figure 8:
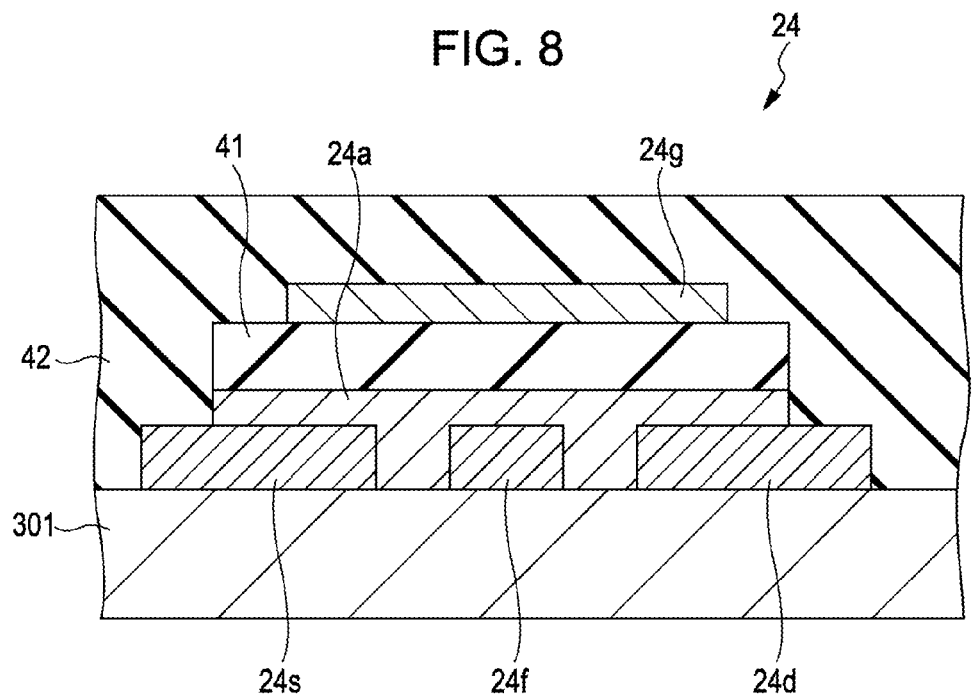
FIG. 8 is a sectional view that schematically illustrates the structure of a pixel-switching transistor according to a second variation example of the invention.

FIG. 8 is a sectional view that schematically illustrates the structure of a pixel-switching transistor according to a second variation example of the invention.

As illustrated in FIG. 8, the pixel-switching transistor 24 may be a bottom-contact top-gate type transistor.

Specifically, the pixel-switching transistor 24 according to the second variation example has the following layered structure. As illustrated in FIG. 8, the gate electrode 24g is formed at a relatively high layer level (i.e., at an upper-layer side) in comparison with the semiconductor layer 24a. Each of the source electrode 24s, the drain electrode 24d, and the floating electrode 24f is formed at a relatively low layer level (i.e., at a lower-layer side) in comparison with the gate electrode 24g. In addition, each of the source electrode 24s, the drain electrode 24d, and the floating electrode 24f is formed at a relatively low layer level (i.e., at a lower-layer side) in comparison with the semiconductor layer 24a.

The structure according to the second variation example has the same characteristic layout as that of the foregoing exemplary embodiment of the invention. That is, in a plan view, the size of the area where the floating electrode 24f and the gate electrode 24g overlap each other is smaller than the sum of the size of the area where the source electrode 24s and the gate electrode 24g overlap each other and the size of the area where the drain electrode 24d and the gate electrode 24g overlap each other. Since the pixel-switching transistor 24 according to the second variation example has such a layout, it is possible to prevent the generation of a leakage current at the pixel-switching transistor 24 without a drop in the ON current of the pixel-switching transistor 24.

Electronic Apparatus

Next, with reference to FIGS. 9 and 10, examples of various kinds of electronic apparatuses to which an electrophoretic display device according to the foregoing exemplary embodiment of the invention is applied is explained below. In the following description, the electrophoretic display device described above is applied to a sheet of electronic paper and an electronic notebook.

Figure 9:
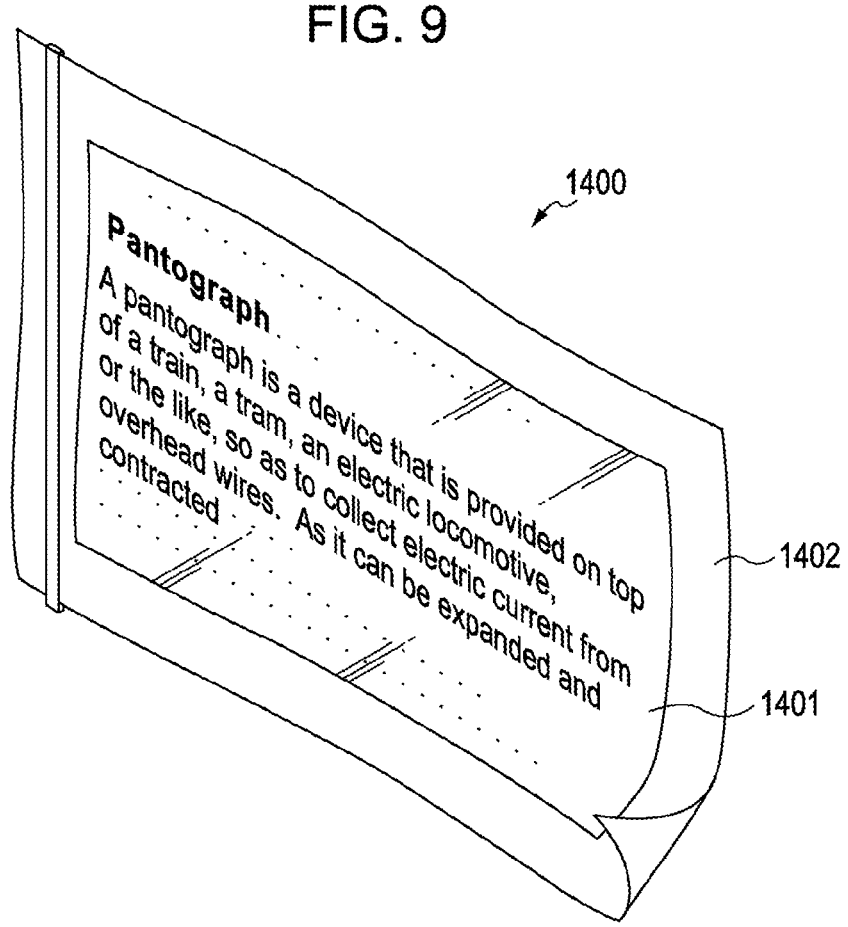
FIG. 9 is a perspective view that schematically illustrates an example of the configuration of electronic paper, which is an example of an electronic apparatus to which an electrophoretic display device according to an exemplary embodiment of the invention is applied.

FIG. 9 is a perspective view that schematically illustrates an example of the configuration of a sheet of electronic paper 1400.

As shown in FIG. 9, the electronic paper 1400 has the electrophoretic display device 1 according to the foregoing exemplary embodiment of the invention as its display unit 1401. The electronic paper 1400 has a thin body portion 1402, which is made of a sheet material that has almost the same texture and flexibility as that of conventional paper, that is, normal non-electronic paper. The electronic sheet is rewritable.

Figure 10:
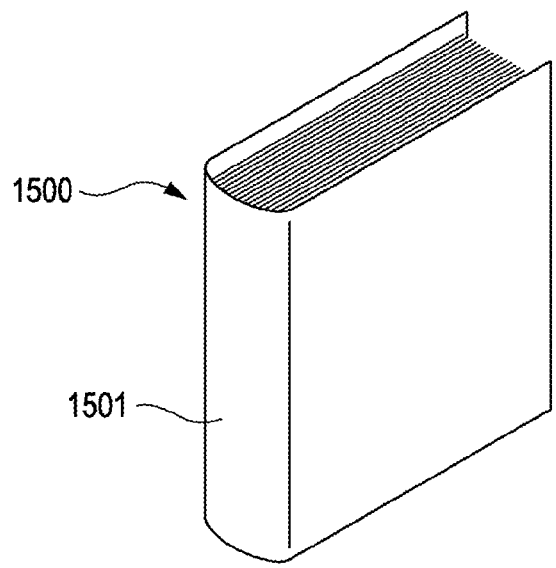
FIG. 10 is a perspective view that schematically illustrates an example of the configuration of an electronic notebook, which is an example of an electronic apparatus to which an electrophoretic display device according to an exemplary embodiment of the invention is applied.

FIG. 10 is a perspective view that schematically illustrates an example of the configuration of an electronic notebook 1500.

As illustrated in FIG. 10, the electronic notebook 1500 has a plurality of sheets of the electronic paper 1400 illustrated in FIG. 9. The electronic notebook 1500 is further provided with a book jacket 1501, which covers the sheets of electronic paper 1400. The book jacket 1501 is provided with a display data input unit that is used for inputting display data sent from, for example, an external device. The display data input unit is not illustrated in the drawing. Having such a configuration, the electronic notebook 1500 illustrated in FIG. 10 is capable of changing or updating (i.e., overwriting) display content in accordance with display data supplied thereto without any need to unbind the electronic paper 1400.

Since the electronic paper 1400 and the electronic notebook 1500 described above is provided with an electrophoretic display device according to the foregoing exemplary embodiment of the invention, it is possible to display an image with a high quality.

Besides an electrophoretic display device described in the foregoing exemplary embodiment of the invention, the concept of the invention can be applied to various kinds of display devices, including but not limited to a liquid crystal display device and an organic electroluminescence (EL) display device.

The scope of the present invention is not limited to the specific embodiment described above. The invention may be modified, altered, changed, adapted, and/or improved within a range not departing from the gist and/or spirit of the invention apprehended by a person skilled in the art from explicit and implicit description given herein as well as recitation of appended claims. A substrate for a semiconductor device subjected to such modification, alteration, change, adaptation, and/or improvement, a semiconductor device that is provided with such a substrate for a semiconductor device, and an electronic apparatus that is provided with such a semiconductor device are also encompassed within the scope of the invention.

The entire disclosure of Japanese Patent Application No. 2009-253223, filed Nov. 4, 2009 is expressly incorporated by reference herein.

What is claimed is:

1. A substrate for a semiconductor device, comprising:
a base substrate;
a semiconductor layer that has a source region, a drain region, a plurality of channel regions, and at least one intermediate region, the plurality of channel regions being formed between the source region and the drain region, and the intermediate region being formed between the channel regions that are adjacent to each other or between each two of the plurality of channel regions that are adjacent to each other;
a source electrode that overlaps the source region in a plan view on or over the base substrate, the source electrode being in contact with the source region;
a drain electrode that overlaps the drain region in a plan view on or over the base substrate, the drain electrode being in contact with the drain region;
a gate electrode that overlaps the plurality of channel regions and the intermediate region and at least partially overlaps each of a part of the source electrode corresponding to the source region, the source electrode overlapping the source region at the part, and a part of the drain electrode corresponding to the drain region, the drain electrode overlapping the drain region at the part, in a plan view on or over the base substrate; and
a floating electrode that overlaps, or is formed at an area or each area substantially corresponding to, the intermediate region in a plan view on or over the base substrate, the floating electrode being in contact with the intermediate region, and the floating electrode being made of the same material as that of the source electrode and the drain electrode,
wherein, in an area where the semiconductor layer is formed on or over the base substrate, in a plan view, the size of an area where the floating electrode and the gate electrode overlap each other is smaller than the sum of the size of an area where the source electrode and the gate electrode overlap each other and the size of an area where the drain electrode and the gate electrode overlap each other.

2. The substrate for a semiconductor device according to claim 1, wherein the source electrode, the drain electrode, and the floating electrode are formed in the same layer.

3. The substrate for a semiconductor device according to claim 1, wherein the gate electrode is formed at a lower-layer-side position in a layered structure in comparison with the semiconductor layer; and each of the source electrode, the drain electrode, and the floating electrode is formed at an upper-layer-side position in the layered structure in comparison with the semiconductor layer.

4. The substrate for a semiconductor device according to claim 1, wherein the gate electrode is formed at a lower-layer-side position in a layered structure in comparison with the semiconductor layer; and each of the source electrode, the drain electrode, and the floating electrode is formed at an upper-layer-side position in the layered structure in comparison with the gate electrode, which is a lower-layer-side position in the layered structure in comparison with the semiconductor layer.

5. The substrate for a semiconductor device according to claim 1, wherein the gate electrode is formed at an upper-layer-side position in a layered structure in comparison with the semiconductor layer; and each of the source electrode, the drain electrode, and the floating electrode is formed at a lower-layer-side position in the layered structure in comparison with the semiconductor layer.

6. A semiconductor device that is provided with the substrate for a semiconductor device according to any of claims 1 to 5.

7. An electronic apparatus that is provided with the semiconductor device according to claim 6.

* * * * *